United States Patent
Lin et al.

(10) Patent No.: US 7,405,604 B2
(45) Date of Patent: Jul. 29, 2008

(54) VARIABLE DELAY CLOCK CIRCUIT AND METHOD THEREOF

(75) Inventors: Chia-Liang Lin, Union City, CA (US); Gerchih Chou, San Jose, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 11/517,415

(22) Filed: Sep. 8, 2006

(65) Prior Publication Data

US 2007/0247202 A1 Oct. 25, 2007

Related U.S. Application Data

(60) Provisional application No. 60/745,188, filed on Apr. 20, 2006.

(51) Int. Cl.
*H03L 7/00* (2006.01)
(52) U.S. Cl. .......................... 327/161; 327/291
(58) Field of Classification Search ............... None
See application file for complete search history.

(56) References Cited

U.S. PATENT DOCUMENTS

| | | | |
|---|---|---|---|
| 5,550,514 A * | 8/1996 | Liedberg | 331/1 A |
| 5,712,580 A | 1/1998 | Baumgartner et al. | |
| 6,154,510 A | 11/2000 | Cochran et al. | |
| 6,157,694 A * | 12/2000 | Larsson | 377/48 |
| 6,185,721 B1 * | 2/2001 | Hosokawa | 716/5 |
| 6,211,741 B1 | 4/2001 | Dalmia | |
| 6,340,904 B1 | 1/2002 | Manning | |
| 6,526,374 B1 * | 2/2003 | Martin | 703/14 |
| 6,538,966 B1 | 3/2003 | Hanks | |
| 6,668,335 B1 * | 12/2003 | Breach et al. | 713/600 |
| 6,707,408 B2 | 3/2004 | Guedon et al. | |
| 6,791,360 B2 * | 9/2004 | Gauthier et al. | 326/93 |
| 6,900,676 B1 | 5/2005 | Tamura | |
| 6,937,073 B2 | 8/2005 | Dally et al. | |
| 6,975,173 B2 * | 12/2005 | Marbot et al. | 331/1 A |
| 7,051,227 B2 * | 5/2006 | Kazachinsky et al. | 713/500 |
| 7,078,949 B2 * | 7/2006 | Kim et al. | 327/158 |
| 7,161,398 B2 * | 1/2007 | Park et al. | 327/149 |
| 2002/0186065 A1 * | 12/2002 | Lammers | 327/291 |
| 2004/0247045 A1 * | 12/2004 | Marbot et al. | 375/316 |
| 2005/0265430 A1 | 12/2005 | Ozluturk et al. | |
| 2005/0285642 A1 * | 12/2005 | Rashid | 327/158 |
| 2006/0017512 A1 | 1/2006 | Huang | |
| 2006/0077297 A1 | 4/2006 | Sonobe | |

\* cited by examiner

*Primary Examiner*—Cassandra Cox
(74) *Attorney, Agent, or Firm*—Rosenberg, Klein & Lee

(57) ABSTRACT

An apparatus for generating an output clock is disclosed. The apparatus comprises: N variable offset clock circuits for receiving N input clocks and for generating N intermediate clocks having N phase offsets controlled by N intermediate signals, respectively, where N>1; a clock multiplexer for selecting one of the N intermediate clocks as the output clock according to a finite-state signal having N possible states; and a finite-state-machine for receiving a control signal and the N intermediate clocks and for generating the finite-state signal and the N intermediate signals.

22 Claims, 5 Drawing Sheets

VARIABLE DELAY CLOCK CIRCUIT AND METHOD THEREOF

REFERENCE TO RELATED APPLICATIONS

This application claims priority of U.S. Provisional Patent Application Ser. No. 60/745,188, filed on Apr. 20, 2006, and is related to the following copending application, owned by the assignee of this invention:
1) Lin et al, Ser. No. 11/517,414, for "DELAY LOCK CLOCK SYNTHESIZER AND METHOD THEREOF".

BACKGROUND OF THE INVENTION

1. Field of the Invention

The present invention relates to a method and apparatus for generating a variable delay clock and in particular to a system of generating clock with an unbounded amount of delay.

2. Description of Related Art

DLL (delay lock loop) is well known in prior art for clock generation. FIG. 1 depicts a functional block diagram of a typical N-stage DLL 100, which comprises: a VCDL (voltage-controlled delay line) 110, a PD (phase detector) 120, and a LF (loop filter) 130. VCDL 110 further comprises N variable delay cells 111_1, 111_2, and so on. VCDL 110 receives an input clock CLK_IN and a control voltage Vc from LF 130, and generates N output clocks CLK_1, CLK_2, and so on. CLK_1 is the output of the $1^{st}$ variable delay cell 111_1, CLK_2 is the output of the $2^{nd}$ variable delay cell 111_2, and so on. All N delay cells (111_1, 111_2, and so on) are constructed from substantially the same circuit; therefore they all cause substantially the same amount of delay to their respective inputs. The phase of the output clock CLK_N from the last variable delay cell 111_N is compared with the phase of the input clock CLK_IN by the PD 120, which generates a phase error signal PE indicative of the phase relationship between the input clock CLK_IN and the output clock CLK_N. The phase error signal PE generated by PD 120 is filtered by the LF 130, resulting in the control voltage Vc to control the delay for each of the N delay cells of VCDL 110. In steady state, a steady control voltage Vc is established so that the output clock CLK_N is aligned with the input clock CLK_IN; the phase error signal PE is virtually zero, indicating no further change to the control voltage Vc is needed. Let the period of the input clock CLK_IN be T. In steady state, each delay cell (111_1, 111_2, and so on) must cause a delay of T/N so that CLK_N can be aligned with CLK_IN. In many applications, a phase inversion operation (not shown in FIG. 1) is performed at the output of the last delay cell to generate an additional 180-degree phase shift (or equivalent T/2 delay). In this case, each delay cell (111_1, 111_2, and so on) causes a delay of T/(2N) in steady state.

A clock multiplexer is often used along with a DLL to generate a clock of a variable phase (or delay). A clock generation system 200 constructed using a N-stage DLL 100 and a clock multiplexer 220 is illustrated in FIG. 2. N-stage DLL 100 receives an input clock CLK_IN and generates N output clocks CLK_1, CLK_2, and so on, in a manner illustrated in FIG. 1. Clock multiplexer 220 receives those N output clocks from N-stage DLL 100 along with a control signal PHASE_SELECT, and generates CLK_OUT as the output clock of the clock generation system 200. The output clock CLK_OUT is selected among the N output clocks CLK_1, CLK_2, and so on, based on the PHASE_SELECT signal.

Although prior art clock generation system 200 can generate a clock with a desired phase (or delay), there are two problems. First, a clock multiplexer circuit is needed. A high frequency clock multiplexer is hard to implement in an integrated circuits, especially when the number of inputs is high. Second, the resolution of the delay depends on the number of stages of delay buffers. In general, a N-stage DLL (with an aforementioned phase inversion at the output of the last delay cell) provides a resolution of 180/N degrees in phase delay. To achieve a 10-degrees resolution of phase delay, for instance, it takes an 18-stage DLL. Therefore, it is impractical to use DLL to generate a variable delay clock with high resolution in the phase delay.

What is needed is a clock generation system that offers a high resolution in clock phase yet does not require a high complexity phase multiplexer.

BRIEF SUMMARY OF THIS INVENTION

In an embodiment, a method for generating an output clock is disclosed, the method comprising: receiving a control signal and N input clocks, where N>1; delaying the N input clocks according to N intermediate signals to generate N intermediate clocks, respectively; selecting one of the N intermediate clocks as the output clock according to a finite-state signal; and generating the finite-state signal and the N intermediate signals in response to the control signal and the N intermediate clocks.

In an embodiment, an apparatus for generating an output clock is disclosed, the apparatus comprising: N variable offset clock circuits for receiving N input clocks and for delaying the N input clocks according to N intermediate signals to generate N intermediate clocks, respectively, where N>1; a clock multiplexer for selecting one of the N intermediate clocks as the output clock according to a finite-state signal; and a finite-state-machine (FSM) for receiving a control signal and the N intermediate clocks and for generating the finite-state signal and the N intermediate signals.

BRIEF DESCRIPTION OF THE DRAWINGS

The subject matter regarded as the invention is particularly pointed out and distinctly claimed in the concluding portion of the specification. The invention, both as to device and method of operation, together with features and advantages thereof may best be understood by reference to the following detailed description with the accompanying drawings in which:

DETAILED DESCRIPTION OF THIS INVENTION

The present invention relates to a method and apparatus for controlling the phase delay of a clock with high resolution in the delay. While the specifications described several example embodiments of the invention considered best modes of practicing the invention, it should be understood that the invention can be implemented in many way and is not limited to the particular examples described below or to the particular manner in which any features of such examples are implemented.

Figure 1:
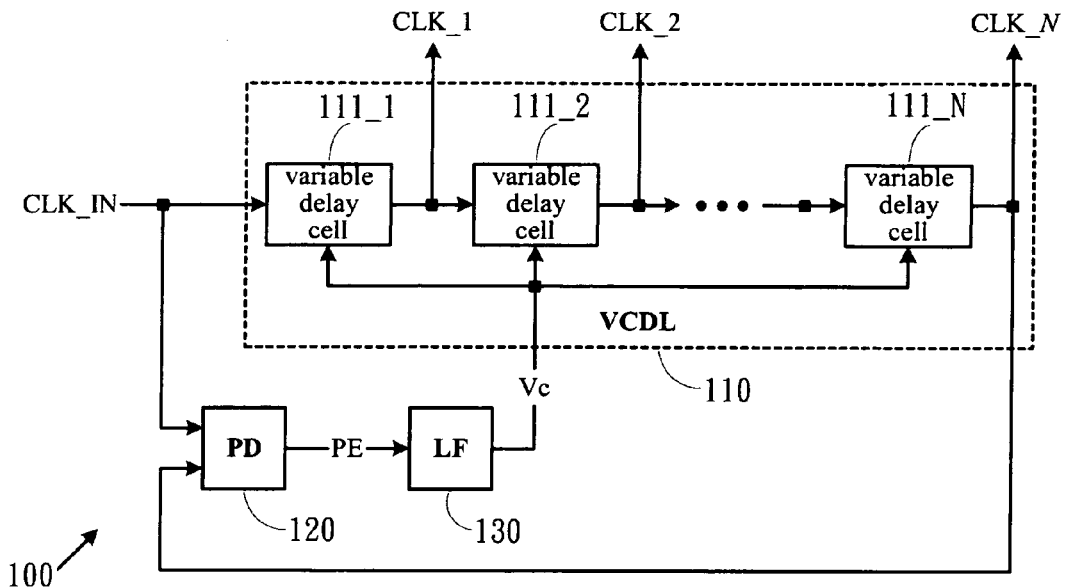
FIG. 1 depicts a functional block diagram of a typical N-stage delay lock loop (DLL)
Figure 2:
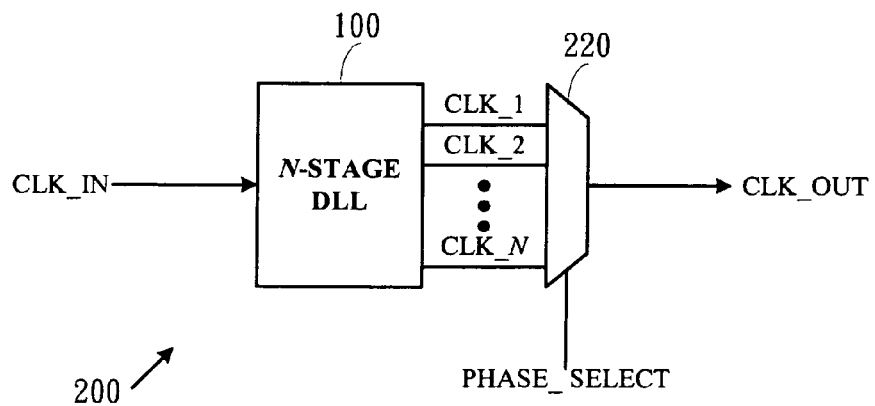
FIG. 2 depicts a functional block diagram of a typical clock generation system.
Figure 3:
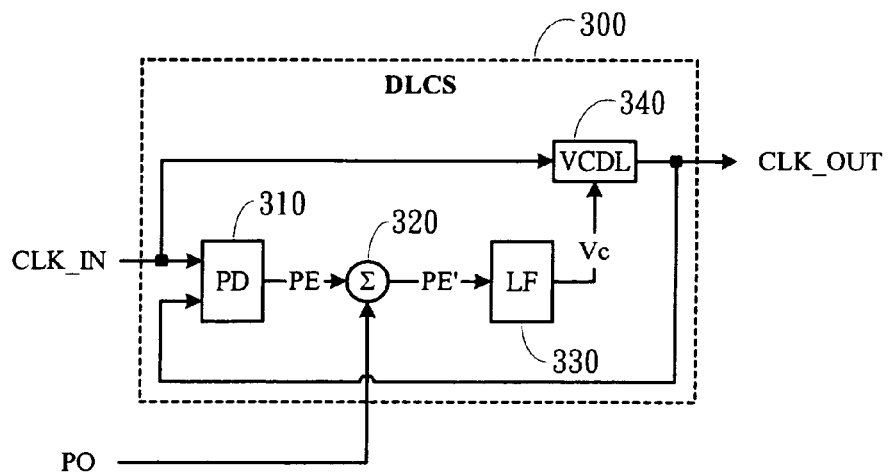
FIG. 3 illustrates an embodiment of a delay clock synthesizer (DLCS) according to the present invention.

A delay clock synthesizer (DLCS) in accordance with the present invention is illustrated in FIG. 3. In this embodiment, DLCS 300 receives an input clock CLK_IN and a phase offset signal PO, and generates an output clock CLK_OUT, which has a phase offset relative to the input clock CLK_IN, wherein the phase offset is controlled by the PO signal. DLCS 300 comprises a phase detector PD 310, a summing circuit 320, a loop filter LF 330, and a voltage controlled delay line VCDL 340. The VCDL 340 receives the input clock CLK_IN and generates the output clock CLK_OUT by delaying the input clock by an amount controlled by a control voltage Vc provided from the loop filter LF 330. The phase detector PD 310 compares a phase of the input clock CLK_IN with a phase of the output clock CLK_OUT and generates accordingly a phase error signal PE representing the phase difference between CLK_IN and CLK_OUT. The phase error signal PE is summed with the PO signal by the summing circuit 320, resulting in a modified phase error signal PE'. The modified phase error signal PE' is filtered by the loop filter LF 330, resulting in the control voltage Vc. In a closed-loop manner, the phase of CLK_OUT is adjusted to establish a certain relationship with the phase of CLK_IN. In steady state, the phase of CLK_OUT settles to a certain value relative to the phase of CLK_IN so that the phase error signal PE is virtually offset by the phase offset signal PO; as a result, the modified phase error signal PE' is virtually zero, indicating no further change to the phase of CLK_OUT is needed. In an embodiment, loop filter LF 330 comprises a capacitor.

In a preferred embodiment, both the phase error signal PE and the phase offset signal PO are current signals. In this case, both signals can be directly tied together to generate the modified phase error signal PE' without using an explicit summing circuit 320.

In a preferred embodiment, PD 310 is implemented as a linear phase detector; every time a phase comparison is made, PD 310 generates a pulse of a fixed magnitude but a variable width proportional to the phase difference between CLK_IN and CLK_OUT. The polarity of the pulse indicates the timing relationship between CLK_IN and CLK_OUT; for example, the pulse is positive if CLK_OUT is earlier than CLK_IN, and is negative otherwise. In a preferred embodiment, the pulse is implemented as an electrical current pulse.

Figure 4:
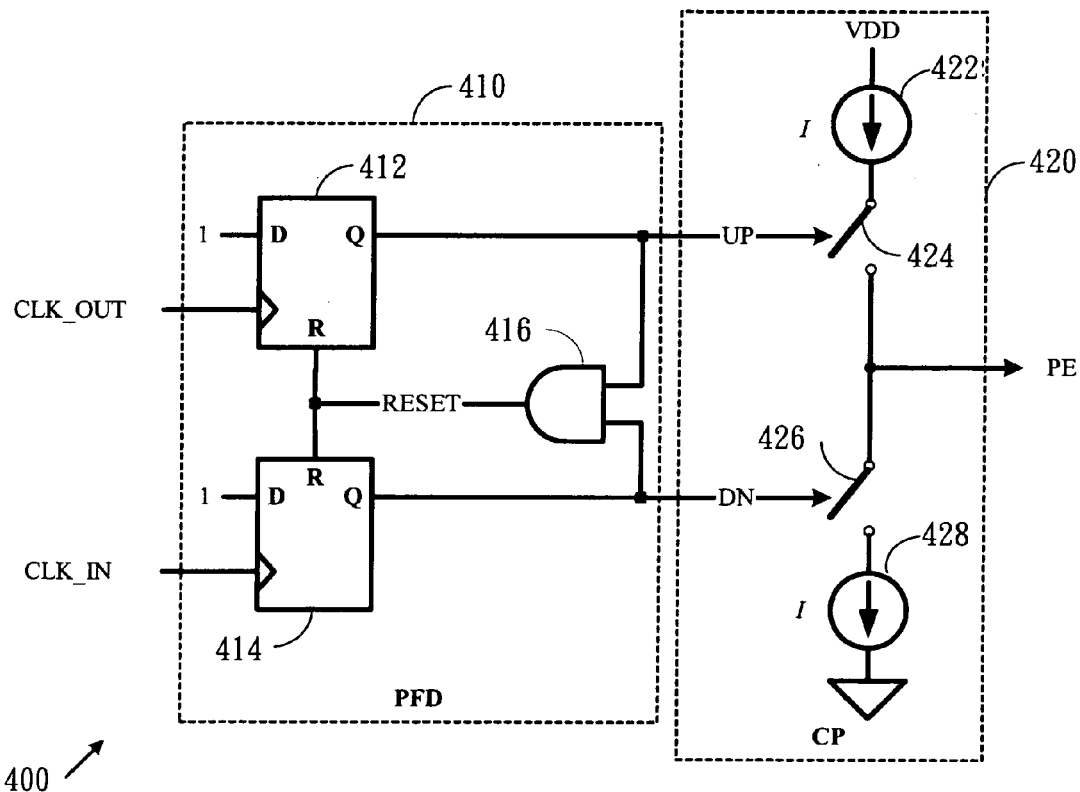
FIG. 4 depicts an exemplary embodiment of the phase detector (PD) of FIG. 3.

An exemplary embodiment for implementing PD 310 of FIG. 3 is depicted in FIG. 4. Here, PD 400 comprises a phase-frequency detector PFD 410 (which is an example of a linear phase detector) and a charge pump circuit CP 420. PFD 410 receives two clock signals: CLK_IN (which is the input clock of DLCS 300 of FIG. 3) and CLK_OUT (which is the output clock of DLCS 300 of FIG. 3), and generates accordingly two logical signals: UP and DN. PFD 410 comprises two data flip-flops (DFF) 412 and 414, and an AND gate 416. Each DFF has four terminals: input terminal D, clock triggering terminal, reset terminal R, and output terminal Q. The principle of PFD is well known in prior art and thus not explained in detail here. The charge pump circuit CP 420 comprises a current source 422 of magnitude I, a first switch 424 controlled by the UP signal, a second switch 426 controlled by the DN signal, and a current sink 428 of magnitude I. The principle of charge pump circuit is also well known in prior art and thus not explained in detail here. When the timing of CLK_OUT is earlier than the timing of CLK_IN by an amount τ, a positive current pulse of magnitude I and width τ is generated in the phase error signal PE; when the timing of CLK_IN is earlier than the timing of CLK_OUT by an amount τ, a negative current pulse of magnitude I and width τ is generated in the phase error signal PE.

Figure 5:
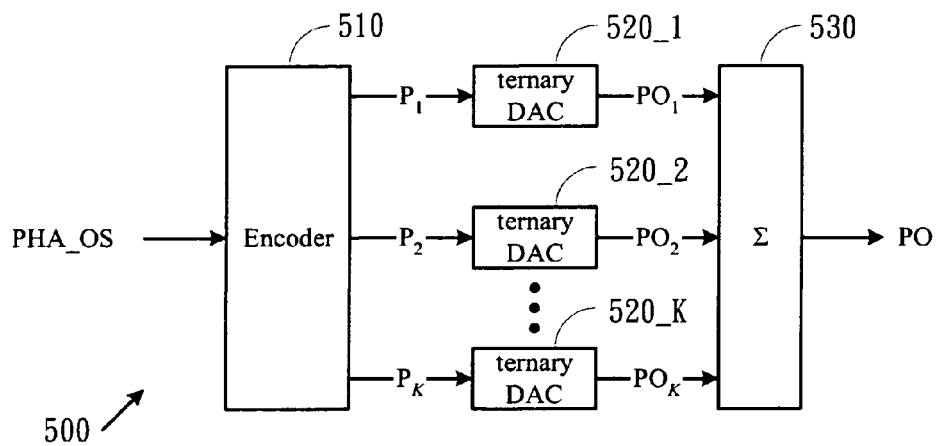
FIG. 5 illustrates an exemplary embodiment for generating the phase offset signal PO.

The phase offset signal PO is preferably generated by a DAC (digital-to-analog converter). An exemplary embodiment for generating the phase offset signal PO using a DAC 500 is illustrated in FIG. 5. In this embodiment, the phase offset is represented by an integer PHA_OS, where $-K \leq PHA\_OS \leq K$ and K is a positive integer. An encoder converts PHA_OS into K ternary codes $P_1$, $P_2$, and so on. Each ternary code has three possible values, say $-1$, 0, and 1. The encoder works in a manner such that the sum of all K ternary codes equals PHA_OS. Each ternary code is received and converted into an analog signal by a ternary DAC (digital-to-analog converter). For example, $P_1$ is received and converted by DAC 520_1, $P_2$ is received and converted by DAC 520_2, and so on. The outputs from all ternary DAC are summed by a summing circuit 530, resulting in the phase offset signal PO. In a preferred embodiment, all ternary DAC are current-mode digital-to-analog converters, and their outputs can be directly tied together to generate the phase offset signal PO without using an explicit summing circuit 530. Note that one may also choose to use an alternative encoder to convert PHA_OS into a plurality of binary codes, each having two possible values (say $-1$ and 1) without departing from the principle of the present invention. Or, one may also choose to use yet an alternative encoder to converter PHA_OS into a combination of binary and ternary codes without departing from the principle of the present invention.

Still refer to FIG. 5. In a preferred embodiment, each ternary DAC (520_1, 520_2, and so on) is implemented using a corresponding charge pump circuit similar to CP 420 of FIG. 4. Each of the K ternary codes ($P_1$, $P_2$, and so on) is represented by two logical signals (see UP and DN of FIG. 4): one to control a first switch (see 424 of FIG. 4) that enables the corresponding charge pump to source a current, and the other to control a second switch (see 426 of FIG. 4) that enables the corresponding charge pump to sink a current. For instance, when the ternary code is 1 (UP==1 and DN==0), the corresponding charge pump sources an outgoing current; when the ternary code is $-1$ (UP==0 and DN==1), the corresponding charge pump sinks an incoming current; when the ternary code is 0 (UP==0 and DN==0), the corresponding charge pump circuit is effectively disabled. In an exemplary embodiment, the current output from each ternary DAC implemented by a corresponding charge pump is: (1) J when the ternary code is 1, (2) $-J$ when the ternary code is $-1$, and (3) zero when the ternary code is 0. The resultant value of the output current representing the PO signal is thus PHA_OS·J. Now refer back to FIG. 3. In steady state, the PE signal has to be offset by the PO signal, i.e. their time-averages (or time-integrals) must be the same but of opposite signs. Let the timing difference between CLK_IN and CLK_CLOCK be τ, then we have the following relation in steady state using a principle of charge conservation:

$$\tau \cdot I = PHA\_OS \cdot J \cdot T$$

or $$\tau = T \cdot PHA\_OS \cdot J/I.$$

Here, I is the current magnitude of the charge pump within the phase detector (see FIG. 4), J is the charge pump current magnitude for each of the ternary DAC from which the phase offset signal PO is generated, PHA_OS an integer controlling the generation of the phase offset signal PO, and T is the period of CLK_IN. The quantity T•PHA_OS•J/I is indeed the phase offset signal PO of FIG. 3 under the embodiment of FIG. 5.

Figure 6:
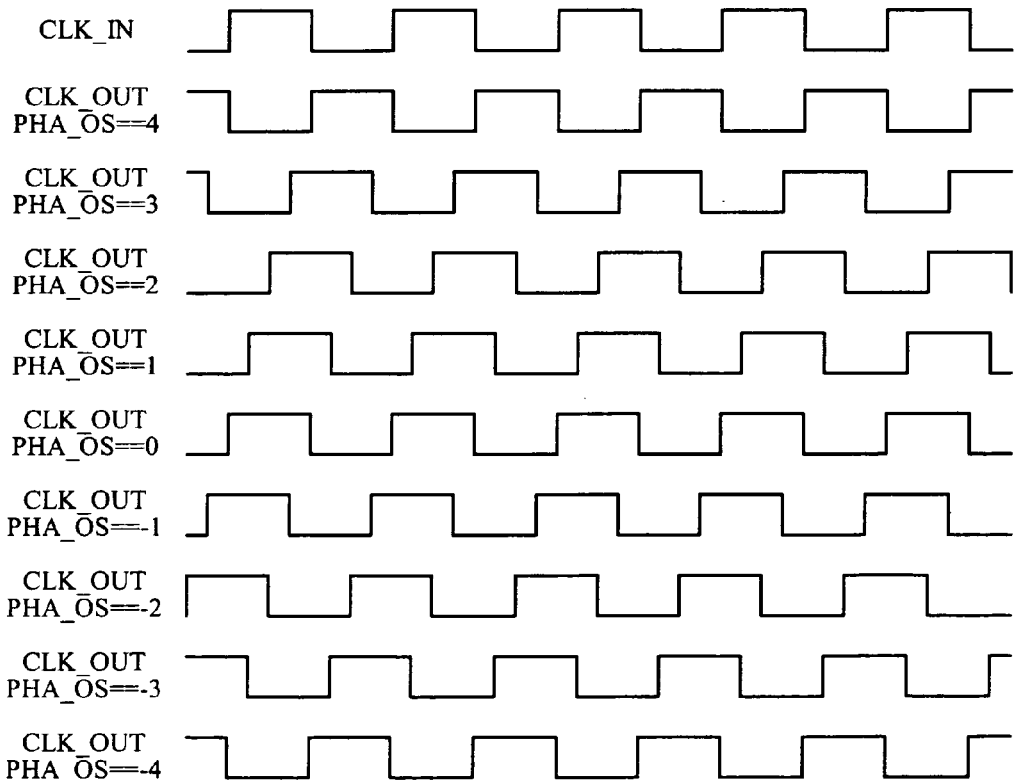
FIG. 6 shows a timing diagram for this instance under various PHA_OS values.

In this manner, a desired phase difference between CLK_IN and CLK_OUT can be established by choosing a proper PHA_OS. For instance, let PHA_OS be an integer between −4 and 4, inclusively. (That is, K=4 for the example in FIG. 5.) Let J be I/8. Then, the timing difference between CLK_IN and CLK_OUT will be T•PHA_OS/8 in steady state. A timing diagram for this instance under various PHA_OS values is shown in FIG. 6. To achieve a high resolution in delay, one simply needs to choose a large K.

Note that the phase offset between the input clock CLK_IN and the output clock CLK_OUT using the embodiment disclosed thus far is bounded within [−T, T], since the phase difference between two clocks of the same frequency, as detected by a phase detector, cannot exceed the clock period. Therefore, the quantity PHA_OS•J/I also needs to be bounded within [−1, 1] to ensure the steady state condition PE'=0 is met. As a result, the phase offset caused by the DLCS 300 is also bounded within [−T, T].

In some applications, it is desirable to synthesize a clock with a phase offset exceeding one full clock cycle. For a phase lock loop application, in particular, the amount of phase offset should be unbounded. In this case, it is more convenient to specify an amount of cycle-to-cycle phase change, rather than an amount of absolute phase offset. By way of example without loss of generality, one uses a ternary signal PHA_CH to indicate an incremental phase change (from last clock cycle), instead of using the PHA_OS signal to indicate an absolute phase offset. The ternary signal PHA_CH has three possible values: 0, 1, and −1. PHA_CH=0 indicates no phase change (from last clock cycle); PHA_CH=1 indicates a further phase delay; and PHA_CH=−1 indicates a further phase advance. The absolute phase offset is a cumulative sum of the PHA_CH signal and is thus unbounded.

In an embodiment, a clock generation system using a dual VDCC (variable delay clock circuit) architecture is used to generate a clock with an unbounded phase offset. A dual VDCC architecture comprises two VDCC; in any moment of operation, one of the two VDCC is in an active state, while the other is in a stand-by state. The VDCC currently in the active state is used for generating a final output clock for the clock generation system, while the VDCC currently in the stand-by state is used for generating a stand-by clock for the clock generation system. Initially, the phase difference between the final output clock and the stand-by clock is 180 degrees. The phase of the final output clock can be adjusted by controlling a phase offset signal for the active VDCC. When the phase of the final output clock is adjusted to an extent that the phase offset equals 180 degrees, we exchange the roles of the two VDCC. That is, the currently stand-by VDCC takes over the role for generating the final output clock, while the other VDCC enters into a stand-by state. Each time we make an exchange of the roles of the two VDCC, we effectively extend the range of phase offset of the final output clock by 180 degrees. In this manner, the phase offset of the final output clock is unbounded.

Figure 7:
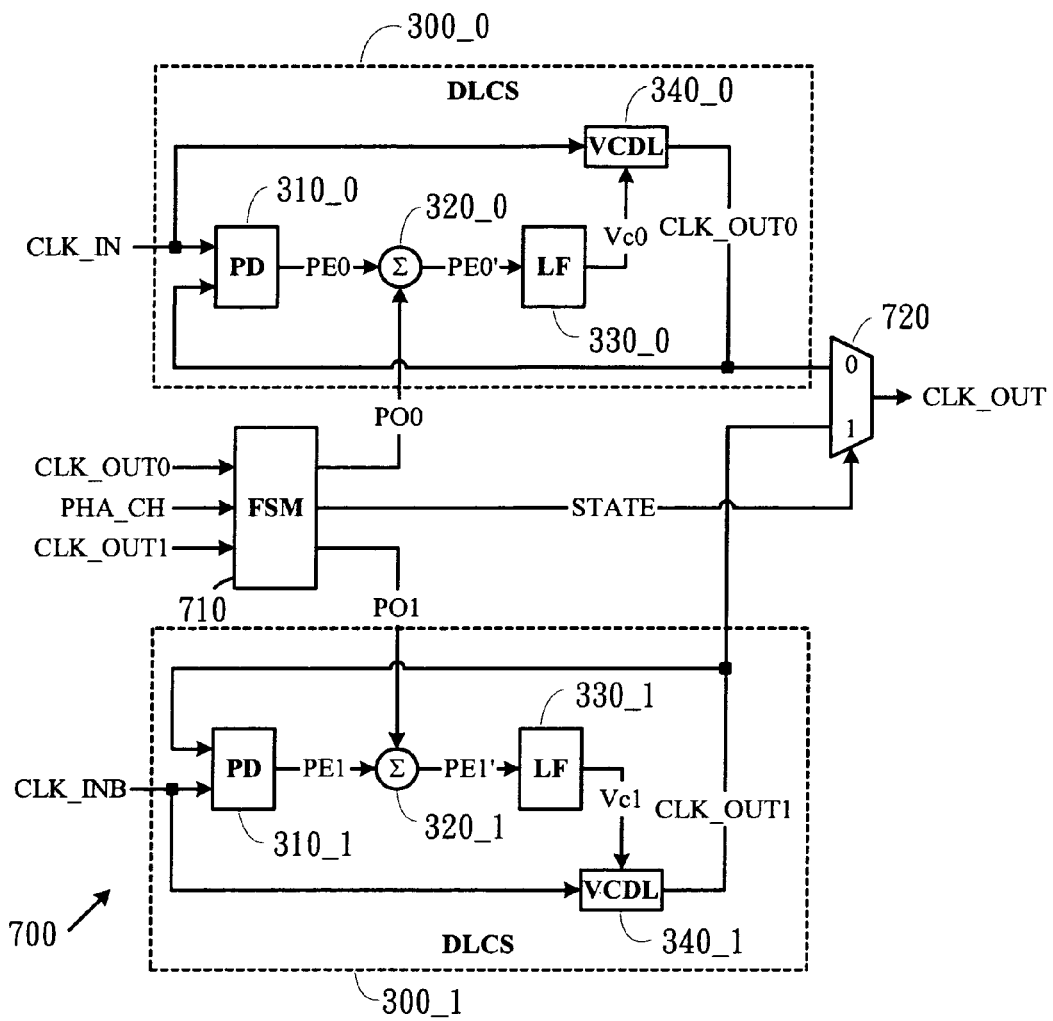
FIG. 7 shows an exemplary variable delay clock synthesizer according to the present invention.

An exemplary variable delay clock synthesizer 700 for achieving unbounded phase offset using a dual DLCS (which is an example of VDCC) architecture is shown FIG. 7. Here, variable delay clock synthesizer 700 comprises two delay lock clock synthesizers (DLCS) 300_0 and 300_1, a multiplexer 720, and a finite state machine (FSM) 710. Both DLCS 300_0 and 300_1 are constructed from the same circuit as DLCS 300 of FIG. 3. DLCS 300_0 receives an input clock CLK_IN and a first phase offset signal PO0, and generates a first output clock CLK_OUT0, which has a phase offset relative to the input clock CLK_IN, the offset being determined by PO0. DLCS 300_1 receives an inverted input clock CLK_INB (which is 180 degrees out of phase relative to the input clock CLK_IN) and a second phase offset signal PO1, and generates a second output clock CLK_OUT1, which has a phase offset relative to the input clock CLK_INB, the phase offset being determined by PO1. Multiplexer 720 receives the first output clock CLK_OUT0 from DLCS 300_0 and the second output clock CLK_OUT1 from DLCS 300_1, and generates a final output clock CLK_OUT based on a logical signal STATE. When STATE is 0, CLK_OUT0 is selected for the final output clock; otherwise, CLK_OUT1 is selected. FSM 710 receives the output clock CLK_OUT0 from DLCS 300_0, the output clock CLK_OUT1 from DLCS 300_1, and a phase change signal PHA_CH, and generates accordingly the first phase offset signal PO0 to control the phase offset for DLCS 300_0, the second phase offset signal PO1 to control the phase offset for DLCS 300_1, and the logical signal STATE to determine which DLCS is selected for generating the final output clock.

Figure 8:
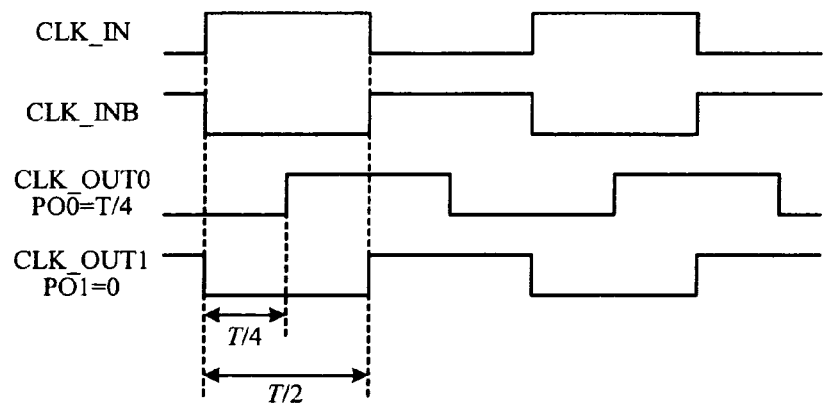
FIG. 8 shows an exemplary timing diagram for a case where STATE=0 and POX=I/4.

The underlying principle of operation for variable delay clock synthesizer 700 is described as follows. By way of example without loss of generality, the phase change signal PHA_CH is a ternary signal with three possible values: 0, 1, and −1. Whenever PHA_CH is non-zero, a phase advance or delay is commanded. Inside FSM 710, there is an up/down counter storing a phase offset variable POX. If PHA_CH is 1, POX is incremented; if PHA_CH is −1, POX is decremented. The DLCS currently selected for generating the final output clock is said to be in an active state, while the other DLCS is said to be in a "stand-by" state. For the active DLCS, the value of the phase offset variable POX is assigned as its corresponding phase offset signal. For the stand-by DLCS, a value of zero (0) is assigned as its corresponding phase offset signal. For instance, when STATE is 0, DLCS 300_0 is in an active state and one assigns the value of POX to the first phase offset signal PO0; in the meanwhile, DLCS 300_1 is in a stand-by state and one assigns zero (0) to the second phase offset signal PO1. When STATE is 1, DLCS 300_1 is in an active state and one assigns the value of POX to the second phase offset signal PO1; in the meanwhile, DLCS 300_0 is in a stand-by state and one assigns zero (0) to the first phase offset signal PO0. Each DLCS circuit works in a closed-loop manner to settle into a condition where its phase error signal is canceled by the corresponding phase offset signal. For instance, for a case where STATE is 0, PE0 will settle to POX and PE1 will settle to zero; as a result, CLK_OUT0 will have a phase offset (relative to CLK_IN) determined by POX, and CLK_OUT1 will have the same phase as CLK_INB. In this manner, the phase of the output clock from the active DLCS is thus advanced or delayed due to the increment or decrement of the phase offset variable POX, while the stand-by DLCS will generate an output clock having the same phase as its corresponding input clock. An exemplary timing diagram for a case where STATE=0 and POX=I/4 is shown in FIG. 8; which shows CLK_OUT1 has a 180 degrees (T/2) delay and CLK_OUT0 has a 90 degrees (T/4) delay, both relative to the input clock CLK_IN.

If the magnitude of the phase offset variable POX reaches I/2, accordingly the phase delay or advance for the active DLCS also reaches T/2. This condition, referred to as "crossover," can be detected, for example, by making a phase comparison between CLK_OUT0 and CLK_OUT1, as CLK_OUT0 and CLK_OUT1 will align with each other at the instant where the phase delay/advance for the active DLCS reaches T/2. In this case, FSM 710 toggles the logical signal STATE, and resets POX, PO0, and PO1 to zero.

Figure 9:
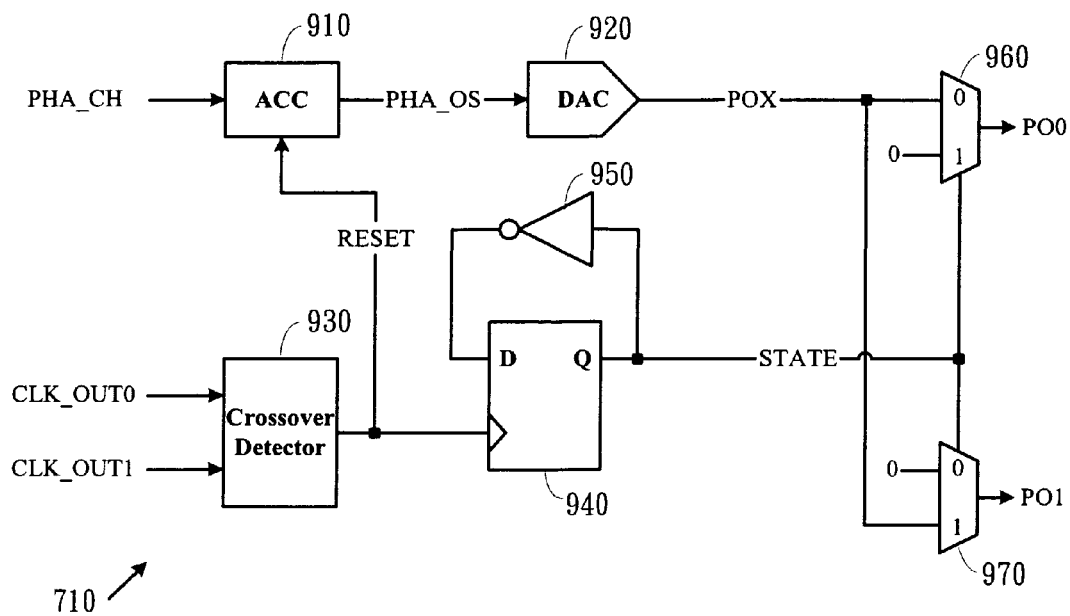
FIG. 9 depicts an exemplary embodiment of FSM according to the present invention.

FIG. 9 depicts an exemplary embodiment for FSM 710. In this embodiment, FSM 710 comprises an accumulator ACC 910, a DAC (digital-to-current converter) 920, a crossover detector 930, a flip-flop 940, a logical inverter 950, a first multiplexer 960, and a second multiplexer 970. ACC 910, which is an up/down counter, receives the ternary signal PHA_CH, which signals ACC 910 to count up, count down, or stay unchanged. The output of ACC 910 is an integer signal PHA_OS, which is converted into an electrical signal POX, preferably implemented as an electrical current signal, by DAC 920, which is preferably implemented using the circuit DAC 500 shown in FIG. 5. Crossover detector 930 receives CLK_OUT0 from DLCS 300_0 and CLK_OUT1 from DLCS 300_1 and generates a logical signal RESET, which is provided for resetting the counter for ACC 910 and for triggering flip-flop 940. Crossover detector 930 detects the condition of the crossover of the two clocks, CLK_OUT0 and CLK_OUT1. Whenever a crossover condition is detected, the RESET signal is asserted to reset the counter value for ACC 910. At the same time, the output of flip-flop 940 is toggled upon the triggering of the RESET signal due to the inverting feedback connection via inverter 950. The output of flip-flop 940, i.e. the STATE signal, is used to determine which DLCS is selected for generating the final output clock. When STATE is 0, DLCS 300_0 is selected; in this case, POX is assigned to PO0 via multiplexer 960, and PO1 is set to zero via multiplexer 970. When STATE is 1, DLCS 300_1 is selected; in this case, POX is assigned to PO1 via multiplexer 970, and PO0 is set to zero via multiplexer 960.

Figure 10:
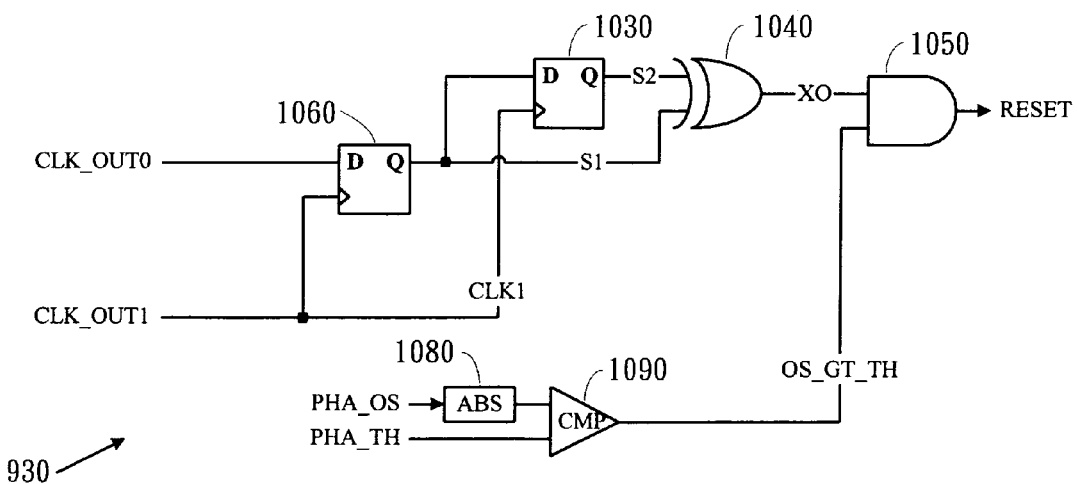
FIG. 10 depicts an exemplary embodiment of crossover detector according to the present invention.

FIG. 10 depicts an exemplary embodiment of crossover detector 930, which comprises a first flip-flop 1060, a second flip-flop 1030, a XOR gate 1040, an AND gate 1050, an ABS (absolute value) operator 1080, and a comparator 1090. CLK_OUT1 is used to sample CLK_OUT0 using flip-flop 1060, resulting in a logical signal S1, which is further sampled by flip-flop 1030, resulting in a logical signal S2. When crossover occurs, i.e. CLK_OUT0 is aligned with CLK_OUT1, S1 will be a logical inversion of S2. The logical signal XO, which is obtained by an XOR operation on S1 and S2 using the logical gate 1040, will be asserted. However, it is obvious to those of ordinary skill in the art that the XO signal will also be asserted when CLK_OUT0 and CLK_OUT1 are 180 degrees out of phase. To avoid a false detection of crossover, we need to further qualify the XO signal using AND gate 1050 and a logical signal OS_GT_TH, which is asserted only when the absolute value of the phase offset variable PHA_OS is greater than a predetermined threshold PHA_TH. ABS 1080 and CMP 1090 are used to generate the logical signal OS_GT_TH, which is indicative of whether or not the absolute value of PHA_OS exceeds the threshold value PHA_TH.

In the embodiment illustrated in FIG. 9, we use a crossover detector to determine a crossover condition, upon which we must assert the logical signal RESET and toggle the STATE signal. In an alternative embodiment without using an explicit crossover detector circuit, we assert the logical signal RESET when the phase offset variable PHA_OS within FSM 710 corresponds to a phase offset of 180 degrees. For example, we expect a crossover condition to occur when the value of PHA_OS·J/I equals ½ or −½, where J is a magnitude of current for each ternary DAC cell within DAC 920 (of FIG. 9) and I is a magnitude of charge pump current within PD 310_0 and PD 310_1. In this alternative embodiment, we predict a crossover condition in an open-loop manner. The prediction will be very accurate if the matching of current magnitude among the charge pump circuits within DAC 920 and the charge pump circuits within PD 310_0 and PD 310_0 is good.

In a further embodiment, the inverted input clock CLK_INB is not exactly 180 degrees out of phase relative to the input clock CLK_IN. For example, it can only be 90 degrees out of phase relative to the input clock CLK_IN. The method disclosed and illustrated in FIG. 9 will still work as long as the crossover condition is properly detected.

For those of ordinary skill in the art, the principle disclosed by the present invention can be practiced in various forms. For example, one may employ three DLCS: one of them is in an active state while the other two are in a stand-by state, and exchange the roles of the active DLCS and one of the two stand-by DLCS when a crossover condition is detected. Also, a DLCS is just an example of a variable delay clock circuit. One can freely replace DLCS 300_0 (or DLCS 300_1) by any variable delay clock circuit, as long as the variable delay clock circuit receives an input clock (CLK_IN or CLK_INB) and an offset signal (PO0 or PO1) and generates an output clock (CLK_OUT0 or CLK_OUT1) that has a phase offset (relative to its input clock, CLK_IN or CLK_INB) determined by the offset signal (PO0 or PO1).

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for generating an output clock, the method comprising:
   receiving a control signal and N input clocks, where N>1;
   delaying the N input clocks according to N intermediate signals to generate N intermediate clocks, respectively;
   selecting one of the N intermediate clocks as the output clock according to a finite-state signal; and
   generating the finite-state signal and the N intermediate signals in response to the control signal and the N intermediate clocks.

2. The method of claim 1, wherein N=2.

3. The method of claim 2, wherein the two input clocks are approximately 180 degrees out of phase.

4. The method of claim 2 further comprising: detecting a crossover condition between the two intermediate clocks.

5. The method of claim 4 further comprising:
   toggling a state of the finite-state signal when a crossover condition is detected.

6. The method of claim 1 further comprising:
   generating an offset signal in response to the control signal.

7. The method of claim 6, wherein the offset signal is an integral of the control signal.

8. The method of claim 6, wherein the offset signal is reset to a predefined value when a crossover condition is detected.

9. The method of claim 6 further comprising:
   assigning the offset signal and a predefined value to the two intermediate signals, respectively.

10. The method of claim 9 further comprising:
    toggling the assignment when a crossover condition is detected.

11. An apparatus for generating an output clock, the apparatus comprising:
    N variable offset clock circuits for receiving N input clocks and for delaying the N input clocks according to N intermediate signals to generate N intermediate clocks, respectively, where N>1;

a clock multiplexer for selecting one of the N intermediate clocks as the output clock according to a finite-state signal; and a finite-state-machine (FSM) for receiving a control signal and the N intermediate clocks and for generating the finite-state signal and the N intermediate signals.

12. The apparatus of claim 11, wherein N=2.

13. The apparatus of claim 12, wherein the two input clocks are approximately 180 degrees out of phase.

14. The apparatus of claim 12, wherein the FSM further comprises:

a crossover detector for detecting a crossover condition between the two intermediate clocks.

15. The apparatus of claim 14, wherein the FSM toggles a state of the finite-state signal when a crossover condition is detected.

16. The apparatus of claim 14, wherein the FSM further generates an offset signal in response to the control signal.

17. The apparatus of claim 16, wherein the offset signal is reset to a predefined value when a crossover condition is detected.

18. The method of claim 16, wherein the FSM maps the offset signal and a predefined value into the two intermediate signals in accordance with a state of the finite-state signal.

19. The apparatus of claim 18, wherein the crossover detector comprises a flip-flop circuit.

20. The apparatus of claim 11, wherein at least one of said variable offset clock circuits comprises:

a phase detector for detecting a phase difference between one of the N input clocks and one of the N intermediate clocks, and for generating a phase error signal representing the phase difference;

a summing circuit for summing the phase error signal and one of the N intermediate signals into a modified phase offset signal;

a filter for filtering the modified phase offset signal and for generating a filtered signal; and an adjustable delay circuit for generating the one of the N intermediate clocks by delaying the one of the N input clock by an amount controlled by the filtered signal.

21. The apparatus of claim 20, wherein the adjustable delay circuit is a voltage controlled delay line.

22. The apparatus of claim 20, wherein the phase detector comprises a charge pump circuit.

* * * * *